United States Patent
Shi et al.

(10) Patent No.: US 8,164,917 B2
(45) Date of Patent: Apr. 24, 2012

(54) BASE PLATE FOR USE IN A MULTI-CHIP MODULE

(75) Inventors: Jing Shi, Carlsbad, CA (US); Nyles Nettleton, Cupertino, CA (US); Bruce M. Guenin, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 26 days.

(21) Appl. No.: 12/646,660

(22) Filed: Dec. 23, 2009

(65) Prior Publication Data

US 2011/0149539 A1 Jun. 23, 2011

(51) Int. Cl.
*H05K 1/18* (2006.01)
*H05K 7/00* (2006.01)

(52) U.S. Cl. ........ 361/764; 361/761; 361/762; 361/763; 361/779

(58) Field of Classification Search .................. 361/760, 361/770, 773, 794, 782, 783, 784, 761–764, 361/777–779; 174/255, 260, 261; 257/685, 257/688, 676, 777, 778

See application file for complete search history.

(56) References Cited

U.S. PATENT DOCUMENTS

| | | | | |
|---|---|---|---|---|
| 5,773,889 | A * | 6/1998 | Love et al. ..................... | 257/737 |
| 5,870,289 | A * | 2/1999 | Tokuda et al. ................ | 361/779 |
| 5,901,046 | A * | 5/1999 | Ohta et al. .................... | 361/760 |
| 6,100,593 | A * | 8/2000 | Yu et al. ........................ | 257/777 |
| 6,424,034 | B1 * | 7/2002 | Ahn et al. ...................... | 257/723 |
| 6,433,411 | B1 * | 8/2002 | Degani et al. ................. | 257/678 |
| 7,348,678 | B2 * | 3/2008 | Zhou et al. .................... | 257/776 |
| 7,592,707 | B2 * | 9/2009 | Krishnamoorthy et al. .. | 257/777 |
| 7,659,619 | B1 * | 2/2010 | Zingher et al. ................ | 257/735 |
| 2002/0117330 | A1 * | 8/2002 | Eldridge et al. .............. | 174/260 |
| 2002/0146919 | A1 * | 10/2002 | Cohn .............................. | 439/66 |
| 2004/0145063 | A1 * | 7/2004 | Sutherland et al. ........... | 257/777 |
| 2006/0001179 | A1 * | 1/2006 | Fukase et al. ................. | 257/778 |
| 2006/0017147 | A1 * | 1/2006 | Drost et al. .................... | 257/686 |
| 2006/0095639 | A1 * | 5/2006 | Guenin et al. ................. | 710/310 |
| 2007/0023921 | A1 * | 2/2007 | Zingher et al. ................ | 257/778 |
| 2007/0075442 | A1 * | 4/2007 | Krishnamoorthy et al. .. | 257/797 |
| 2007/0096330 | A1 * | 5/2007 | Shizuno ........................ | 257/774 |
| 2007/0194425 | A1 * | 8/2007 | Zingher ........................ | 257/686 |
| 2007/0268047 | A1 * | 11/2007 | Hopkins et al. ............... | 327/111 |
| 2007/0268125 | A1 * | 11/2007 | Ho et al. ...................... | 340/539.1 |
| 2007/0278696 | A1 * | 12/2007 | Lu et al. ........................ | 257/777 |
| 2008/0106951 | A1 * | 5/2008 | Olesinski et al. ........ | 365/189.05 |
| 2009/0051024 | A1 * | 2/2009 | Chia ............................ | 257/686 |

(Continued)

*Primary Examiner* — Timothy Thompson
*Assistant Examiner* — Sherman Ng
(74) *Attorney, Agent, or Firm* — Park, Vaughan, Fleming & Dowler LLP; Steven E. Stupp

(57) ABSTRACT

A base mechanism for use in a multi-chip module (MCM) is described. This base mechanism includes a substrate having top and bottom surfaces. The bottom surface includes first electrical connectors that convey power, and through-substrate vias (TSVs) between the top and bottom surfaces are electrically coupled to these electrical connectors. Furthermore, a bridge chip is rigidly mechanically coupled to the top surface. This bridge chip includes proximity communication connectors that communicate information via proximity communication with one or more island chips in the MCM. Additionally, spacers are rigidly mechanically coupled to the top surface of the substrate. In conjunction with the bridge chip, the spacers define cavities on the top surface, which include second electrical connectors. These second electrical connectors are electrically coupled to the TSVs, and communicate additional information with and convey power to the one or more island chips.

20 Claims, 10 Drawing Sheets

U.S. PATENT DOCUMENTS

| | | | |
|---|---|---|---|
| 2009/0085183 A1* | 4/2009 | Mitchell et al. | 257/686 |
| 2009/0089466 A1* | 4/2009 | Cunningham et al. | 710/100 |
| 2009/0127722 A1* | 5/2009 | Noelscher et al. | 257/797 |
| 2009/0145636 A1* | 6/2009 | Miki et al. | 174/255 |
| 2009/0322377 A1* | 12/2009 | Eberle et al. | 326/101 |
| 2010/0327466 A1* | 12/2010 | Drost et al. | 257/785 |

* cited by examiner

⎯ 800

```
ONE OR MORE ISLAND CHIPS ARE PLACED PROXIMATE TO CAVITIES IN A
BASE MECHANISM IN AN MCM
810
```

↓

```
APPLY PRESSURE, VIA AT LEAST ONE PRESSURE PLATE TO TOP SURFACES OF THE
ONE OR MORE ISLAND CHIPS WHILE RIGID MECHANICAL COUPLING IS ESTABLISHED
812

HOLD THE ONE OR MORE ISLAND CHIPS IN PLACE USING A PRESSURE LESS
THAN ATMOSPHERIC PRESSURE WHILE THE RIGID MECHANICAL COUPLING IS
ESTABLISHED
(OPTIONAL)
814
```

FIG. 8

BASE PLATE FOR USE IN A MULTI-CHIP MODULE

BACKGROUND

1. Field

The present disclosure generally relates to multi-chip modules (MCMs) and techniques for fabricating MCMs in computer systems. More specifically, the present disclosure relates to an MCM that includes a base plate having a common configuration that facilitates communication with chips in the MCM.

2. Related Art

In existing processor-cache multi-chip modules (MCMs), both processor and SRAM cache chips are soldered onto a substrate with all of their input/output (I/O) connections passing through the substrate. Because of the large number of I/O signals, the routing of wires within the substrate may involve more layers than in a single-chip package, which can significantly increase the cost of the substrate in the MCMs.

Proximity communication can be used to communicate I/O signals within an MCM through capacitive pads between facing island and bridge chips in the MCM. By communicating the high-speed signals between the island chips via the bridge chips, proximity communication allows the complicated and expensive routing of wires through substrates to be simplified. As a consequence, proximity communication may significantly reduce the costs of the MCM.

However, in many proposed MCM designs which use proximity communication, the design of the substrate, the island chips, and the bridge chips, as well as the associated assembly processes, are customized and individually optimized for specific applications. Having to consider both the package design (thermal mechanical) and the proximity-communication channel performance (signal integrity) can increase the design-cycle time of an MCM, especially when application-specific integrated circuits (ASICs) from different vendors are integrated in the MCM.

Hence, what is needed is an MCM and an associated fabrication technique which do not suffer from the above-described problems.

SUMMARY

One embodiment of the present disclosure provides a base mechanism (such as a base plate) for use in a multi-chip module (MCM). This base mechanism includes a first substrate having a first surface and a second surface. This first surface includes first electrical connectors that convey power, and through-substrate vias (TSVs) between the first surface and the second surface are electrically coupled to the first electrical connectors. Furthermore, the base mechanism includes a bridge chip rigidly mechanically coupled to the second surface. This bridge chip includes proximity communication connectors, disposed on a top surface of the bridge chip, that communicate information via proximity communication with one or more island chips in the MCM. Additionally, the base mechanism includes spacers, rigidly mechanically coupled to the second surface, which in conjunction with the bridge chip define cavities on the second surface that have a depth. Note that second electrical connectors, disposed on the second surface within the cavities and electrically coupled to the TSVs, communicate additional information with and convey power to the one or more island chips.

A wide variety of materials may be used to fabricate the first substrate, including: a semiconductor, a ceramic material, an organic material and/or a printed circuit board. Furthermore, the bridge chip may include a second substrate. This second substrate may include a semiconductor with active electronics, such as transmit and receive electrical circuits. Alternatively, the second substrate may include a material other than a semiconductor, and the bridge chip may be a passive device. In some embodiments, the spacers are defined using an additive fabrication process and/or a subtractive fabrication process.

Note that the bridge chip may include additional TSVs that are electrically coupled to the proximity communication connectors, as well as solder connections to the second surface. Moreover, the proximity communication may include: optical proximity communication, capacitive proximity communication, inductive proximity communication and/or conductive proximity communication.

In some embodiments, the bridge chip is defined on the first substrate. Alternatively, the bridge chip is embedded in the first substrate. For example, the first substrate may be built up around the sides of the bridge chip.

Furthermore, the second electrical connectors may include: solder pads, an interposer and/or microspring inter-component connectors. For example, the microspring inter-component connectors may include claw connectors. Alternatively or additionally, the second electrical connectors may provide mechanical compliance greater than a predefined value in a direction perpendicular to the second surface. Note that the second electrical connectors may include additional proximity communication connectors.

In some embodiments, the proximity communication connectors are arranged in selectable groups that facilitate the use of the base mechanism in different configurations of the MCM in which a given island chip communicates the information with the base mechanism via one or more of the selectable groups. For example, the same base mechanism may be used to electrically couple to the island chips having a different number of proximity communication connectors (such as customized application-specific integrated circuits), while using a common configuration for the bridge chip.

Another embodiment provides an MCM that includes the base mechanism and one or more island chips having third proximity communication connectors disposed on their surfaces. In this MCM, the first proximity communication connectors disposed on the top surface of the bridge chip communicate the information via proximity communication with the third proximity communication connectors. Furthermore, the second electrical connectors disposed on the second surface within the cavities on the base mechanism communicate the additional information with and convey power to the one or more island chips.

Another embodiment provides a method for assembling an MCM. During this method, one or more of the island chips are placed proximate to cavities in the base mechanism in the MCM. Note that the cavities are defined by the spacers and the bridge chip on the top surface of the base mechanism, and that the bridge chip is rigidly mechanically coupled to the top surface of the base mechanism. Furthermore, the second electrical connectors are disposed on the top surface of the base mechanism within the cavities, and there are proximity communication connectors disposed on the top surface of the bridge chip to communicate the information via proximity communication with the one or more island chips. Then, pressure is applied, via at least one pressure plate, to top surfaces of the one or more island chips in the MCM while rigid mechanical coupling between the bottom surfaces of the island chips and the top surface of the base mechanism in the MCM is established via the electrical connectors.

In some embodiments, during the method the island chips are held in place using a pressure less than atmospheric pressure (i.e., vacuum) while the rigid mechanical coupling is established. Furthermore, there may be multiple pressure plates, where a given pressure plate in the multiple pressure plates applies pressure to the top surface of a given island chip in the one or more island chips.

Another embodiment provides an electronic device that includes the MCM.

BRIEF DESCRIPTION OF THE FIGURES

FIG. 8 is a flow chart illustrating a process for assembling an MCM in accordance with an embodiment of the present disclosure.

Note that like reference numerals refer to corresponding parts throughout the drawings. Moreover, multiple instances of the same type of part are designated by a common prefix separated from an instance number by a dash.

DETAILED DESCRIPTION

Embodiments of a base mechanism, a multi-chip module (MCM) that includes the base mechanism, and a technique for assembling the MCM are described. This base mechanism includes a substrate having top and bottom surfaces. The bottom surface includes first electrical connectors that convey power, and through-substrate vias (TSVs) between the top and bottom surfaces are electrically coupled to these electrical connectors. Furthermore, a bridge chip is rigidly mechanically coupled to the top surface (e.g., it is embedded or integrated into the base plate). This bridge chip includes proximity communication connectors that communicate information via proximity communication with one or more island chips in the MCM. Additionally, spacers are rigidly mechanically coupled to the top surface of the substrate. In conjunction with the bridge chip, the spacers define cavities on the top surface, which include second electrical connectors. These second electrical connectors are electrically coupled to the TSVs, and communicate additional information with and convey power to the one or more island chips.

This base mechanism may facilitate a lower cost MCM and faster development time cycles. In particular, by using a common configuration of the proximity connectors on the bridge chip, which are arranged in the selectable groups, the problem of MCM cost and development time may be solved. For example, the base mechanism may be used in different configurations of the MCM in which a given island chip communicates the information with the base mechanism via one or more of the selectable groups. Thus, the same base mechanism may be used to electrically couple to the island chips having a different number of proximity communication connectors (such as customized application-specific integrated circuits or ASICs), while using a common configuration for the bridge chip (which may be based on design rules for the proximity communication input/output block that can be used in a standard library). Consequently, the design of the island chips and the base plate may be, at least in part, decoupled, which may reduce the cost and time-to-market of the MCM. Furthermore, a standard proximity-communication interface may allow the substrate to accommodate heterogeneous ASIC chips from different manufacturers, as well as from different process nodes.

Figure 1:
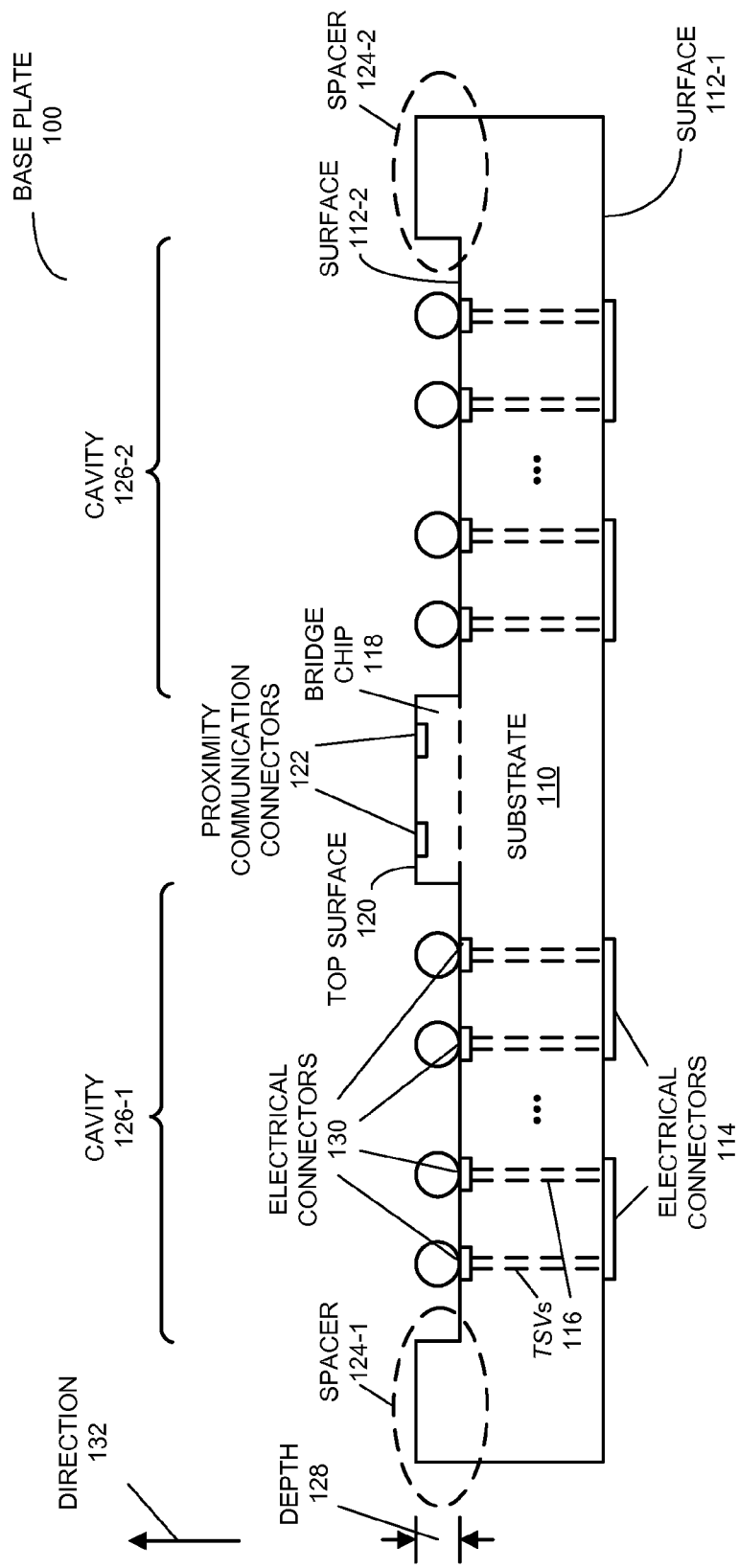
FIG. 1 is a block diagram illustrating a base plate for use in a multi-chip module (MCM) in accordance with an embodiment of the present disclosure.

We now describe embodiments of the base mechanism (such as base plate) and the MCM. FIG. 1 presents a block diagram illustrating a cross-sectional view of a base plate 100 for use in the MCM. This base plate includes a substrate 110, which may be several hundred microns thick, and which has surfaces 112. Surface 112-1 includes electrical connectors 114 (such as ball-grid-array or large-grid-array pads) that convey power, and through-substrate vias (TSVs) 116 (such as plated copper) between surfaces 112 are electrically coupled to electrical connectors 114. Furthermore, base plate 100 includes a bridge chip 118 rigidly mechanically coupled to surface 112-2. This bridge chip includes proximity communication connectors 122, disposed on a top surface 120 of bridge chip 118, which communicate information via proximity communication with one or more island chips in the MCM (as illustrated below in FIG. 5). Moreover, the proximity communication may include: communication of optical signals (such as 'optical proximity communication'), communication of capacitively coupled signals ('electrical proximity communication' or 'capacitive proximity communication') and/or communication of electromagnetically coupled signals (which is referred to as 'electromagnetic proximity communication'). For example, the electromagnetic proximity communication may include inductively coupled signals ('inductive proximity communication') and/or conductively coupled signals ('conductive proximity communication').

Additionally, base plate 100 includes spacers 124, which are rigidly mechanically coupled to surface 112-2, and which, in conjunction with bridge chip 118, define cavities 126 on surface 112-2 that have a depth 128 (which may equal a thickness of bridge chip 118). Note that electrical connectors 130, which are disposed on surface 112-2 within cavities 126 and electrically coupled to TSVs 116, communicate additional information with and convey power to the one or more island chips. In some embodiments, spacers 124 are defined using an additive fabrication process and/or a subtractive fabrication process.

A wide variety of materials may be used to fabricate substrate 110, including: a semiconductor (such as silicon), a ceramic material, an organic material, a plastic material and/or a printed circuit board. In some embodiments, bridge chip 118 is defined and/or fabricated on substrate 110. However, bridge chip 118 may include another substrate. This other substrate may include a semiconductor with active electronics, such as transmit and receive electrical circuits (not shown). Alternatively, the other substrate may include a material other than a semiconductor (such as a ceramic material, an organic material, glass, a printed circuit board and/or a plastic material), and bridge chip 118 may be a passive device.

Additionally, electrical connectors 130 may include: solder pads (such as C4 pads), an interposer and/or microspring inter-component connectors. For example, the microspring inter-component connectors may include claw connectors. Note that electrical connectors 130 may provide mechanical compliance greater than a predefined value in a direction 132 perpendicular to surface 112-2. For example, the mechanical compliance may allow a displacement along direction 132 of 1-10 µm. In some embodiments, electrical connectors 130 include additional proximity communication connectors.

Figure 2:
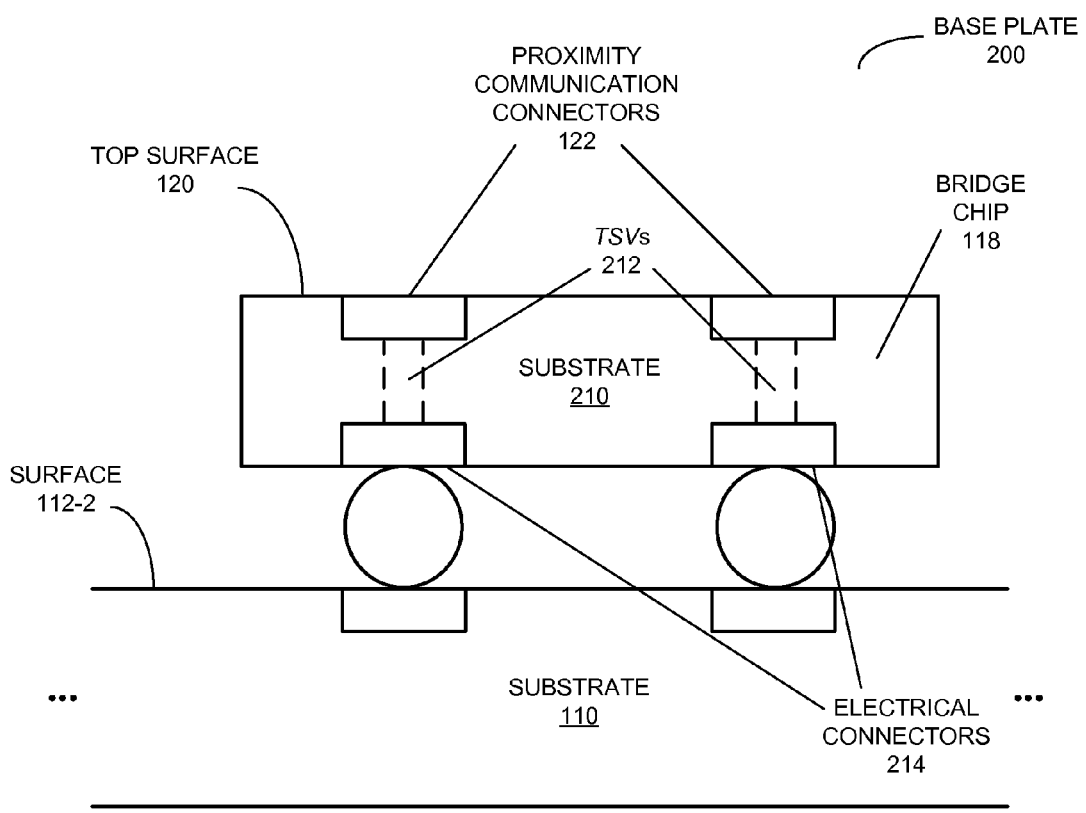
FIG. 2 is a block diagram illustrating a base plate for use in an MCM in accordance with an embodiment of the present disclosure.

In embodiments where bridge chip 118 includes the other substrate, bridge chip 118 may be rigidly mechanically coupled to surface 112-2 using a variety of techniques. For example, as shown in FIG. 2, which presents a block diagram illustrating a cross-sectional view of a base plate 200 for use in the MCM, bridge chip 118 may include substrate 210 with TSVs 212 (such as plated copper) that are electrically coupled to proximity communication connectors 122 and electrical connectors 214, which may be used with solder, an anisotropic conductive paste and/or glue to electrically couple to second surface 112-2. Note that electrical connectors 214 receive power and electrical signals associated with the information from base plate 100 (FIG. 1) via metal traces or a redistribution layer on substrate 110. In general, bridge chip 118 may be positioned and attached to substrate 110 using a flip-chip process and/or a pick-and-place process.

Figure 3:
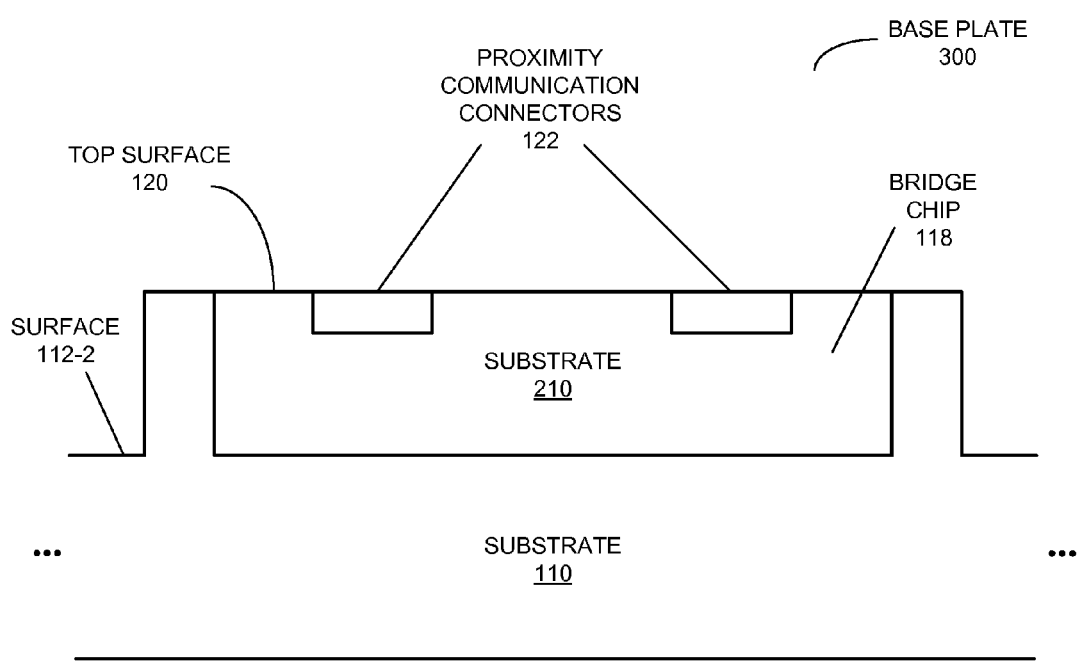
FIG. 3 is a block diagram illustrating a base plate for use in an MCM in accordance with an embodiment of the present disclosure.

Alternatively, as shown in FIG. 3, which presents a block diagram illustrating a cross-sectional view of base plate 300 for use in the MCM, bridge chip 118 may be embedded in substrate 110. For example, substrate 110 may be built up around the sides of bridge chip 118. While not shown in FIG. 3, electrical connectors on top surface 120 may be electrically coupled to substrate 110 (for example, via traces or interconnects) to receive power and electrical signals associated with the information from substrate 110.

Figure 4:
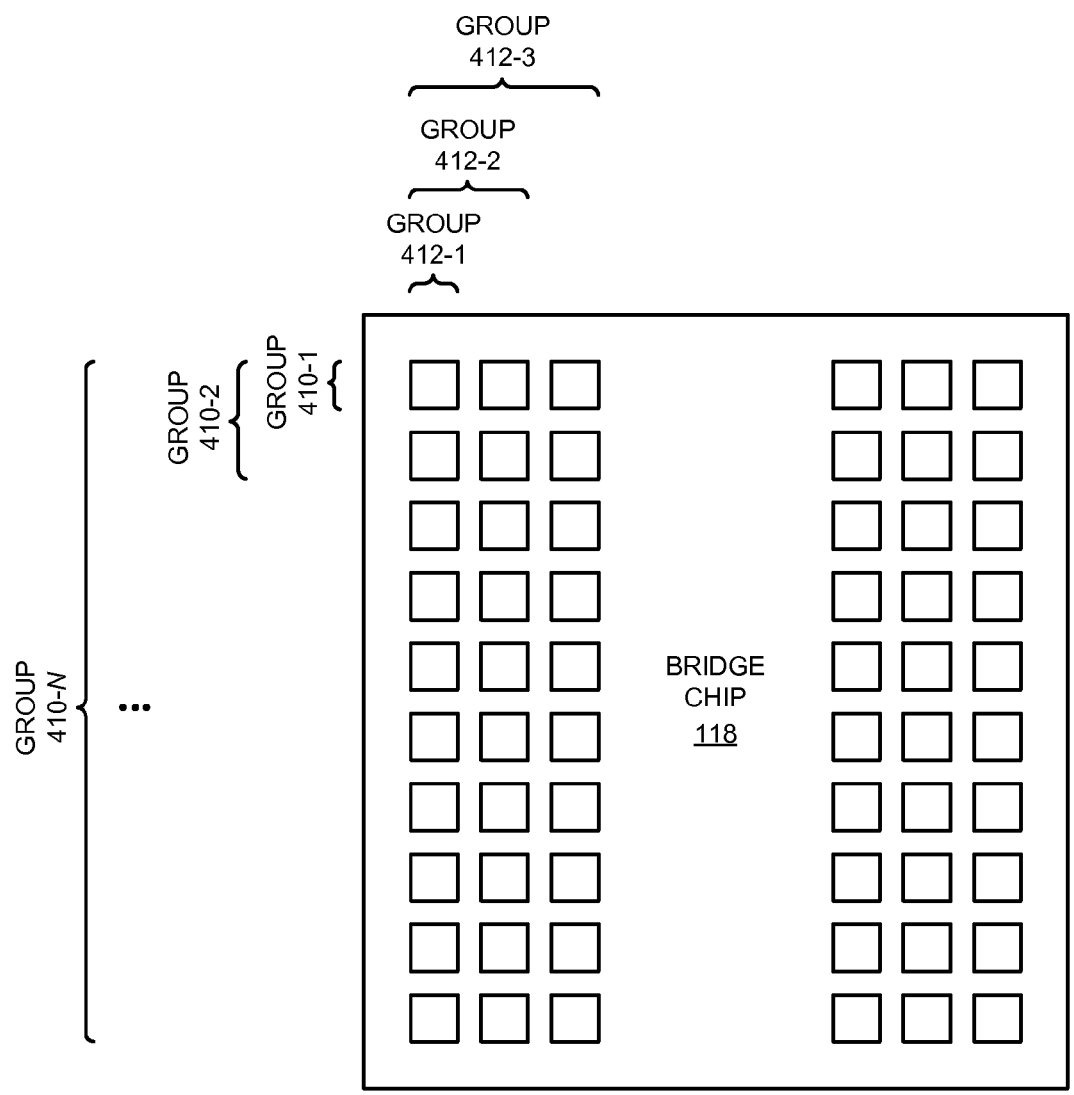
FIG. 4 is a block diagram illustrating proximity communication connectors on a bridge chip in a base plate for use in an MCM in accordance with an embodiment of the present disclosure.

As shown in FIG. 4, which presents a block diagram illustrating a top view of proximity communication connectors 122 on bridge chip 118 in a base plate for use in the MCM, proximity communication connectors 122 may be arranged in selectable groups 410 and 412 that facilitate the use of the base plate in different configurations of the MCM in which a given island chip communicates the information with the base plate via one or more of selectable groups 410 and 412. For example, the same base plate may be used to electrically couple to the island chips having a different number of proximity communication connectors (such as customized ASICs), while using a common configuration for bridge chip 118. In an exemplary embodiment, proximity communication connectors 122 include three columns and 25 rows, and an island chip may use one column and all of the rows, or all three of the columns and all of the rows. Alternatively, an island chip may use all three of the columns and a central nine of the rows.

Thus, proximity communication connectors 122 (as well as electrical connectors 130 in FIG. 1) may be laid out based on pre-defined design rules (such as column input/output constraints, etc.), thereby decoupling (at least in part) the design of the island chips and the base plate for use in the MCM. Consequently, integrated-circuit designers may only need to know the design rules for the proximity-communication channel (so that the assembly and packaging of the island chips is transparent to the design house), and assembly by the assembly house may be 'decoupled' from fabrication by the base-plate manufacturer, etc.

Figure 5:
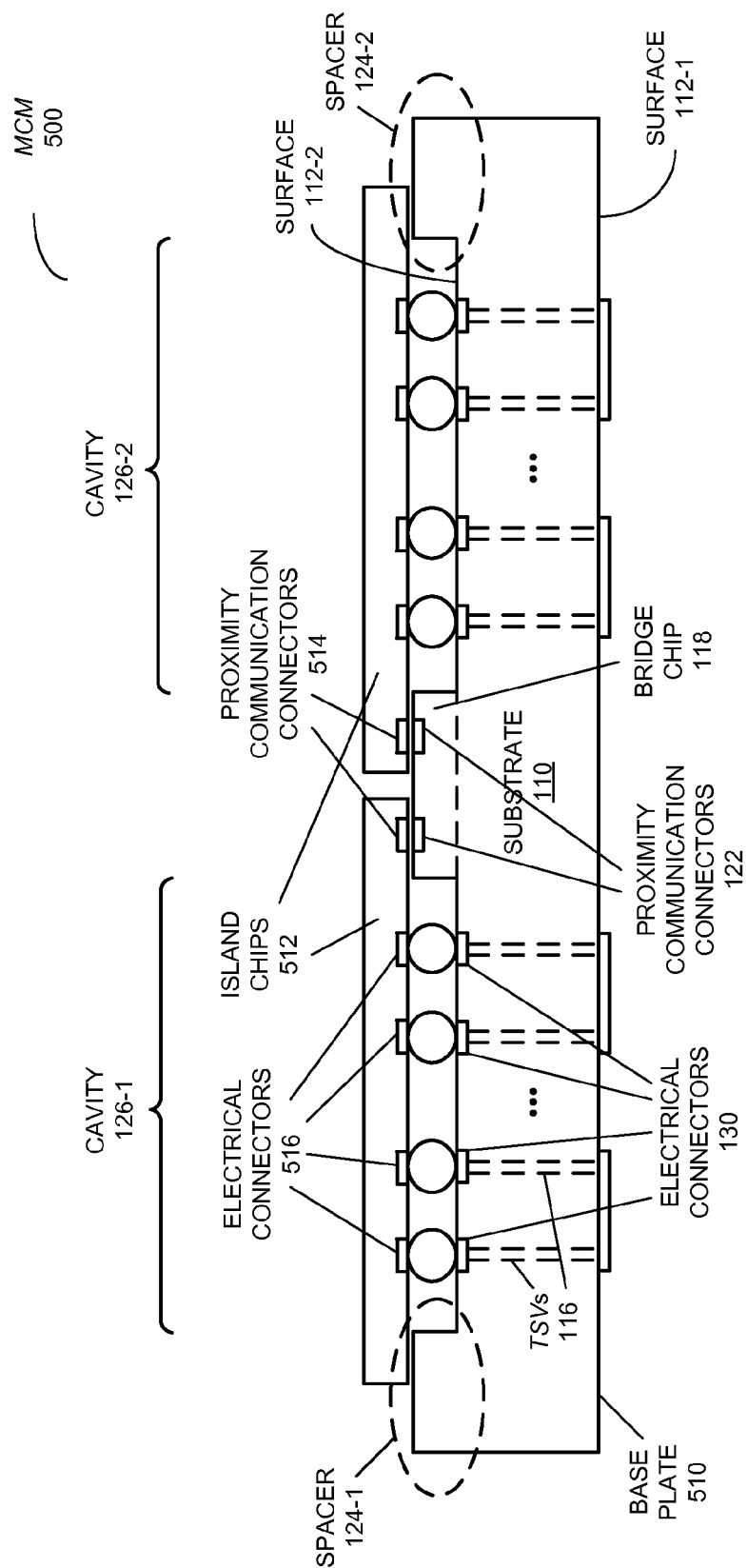
FIG. 5 is a block diagram illustrating an MCM in accordance with an embodiment of the present disclosure.

FIG. 5 presents a block diagram illustrating MCM 500. This MCM includes a base plate 510 (such as one of the preceding embodiments of the base plate) and island chips 512. These island chips have proximity communication connectors 514 disposed on their surfaces. In this MCM, proximity communication connectors 122 communicate the information via proximity communication with proximity communication connectors 514. Furthermore, electrical connectors 130 communicate the additional information with and convey the power to electrical connectors 516 on island chips 512.

In general, MCM 500 may include an array of chip modules (CMs) or single-chip modules (SCMs), and a given SCM may include at least one substrate, such as a semiconductor die. Note that an MCM is sometimes referred to as a 'macro-chip.' Furthermore, the substrate may communicate with other substrates, CMs and/or SCMs in MCM 500 using proximity communication.

Figure 6:
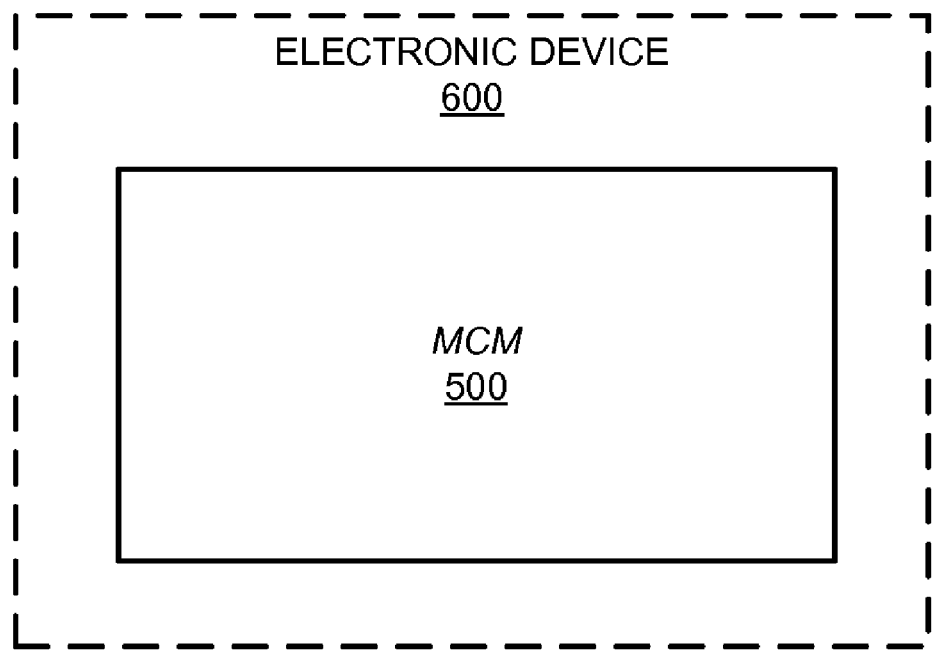
FIG. 6 is a block diagram of an electronic device that includes an MCM in accordance with an embodiment of the present disclosure.

One or more of the preceding embodiments of MCM 500 may be included in a system and/or an electronic device. This is shown in FIG. 6, which presents a block diagram of an electronic device 600 that includes an MCM 500.

Furthermore, embodiments of MCM 500 may be used in a variety of applications, including: VLSI circuits, communication systems (such as in wavelength division multiplexing), storage area networks, data centers, networks (such as local area networks), and/or computer systems (such as multiple-core processor computer systems). For example, MCM 500 may be included in a backplane that is coupled to multiple processor blades, or MCM 500 may couple different types of components (such as processors, memory, input/output devices, and/or peripheral devices). In some embodiments, MCM 500 performs the functions of: a switch, a hub, a bridge, and/or a router.

Note that electronic device 600 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

Base plates in FIGS. 1-4, MCM 500 (FIG. 5) and/or electronic device 600 may include fewer components or additional components. For example, there may be four columns, and thus four groups 412, in FIG. 4. Furthermore, although these embodiments are illustrated as having a number of discrete items, these base plates, MCMs, and electronic devices are intended to be functional descriptions of the various features that may be present rather than structural schematics of the embodiments described herein. Consequently, in these embodiments two or more components may be combined into a single component, and/or a position of one or more components may be changed.

Note that the base plate may be fabricated using an additive process (i.e., a material-deposition process) and/or a subtractive process (i.e., a material-removal process). For example, the process may include: sputtering, plating, isotropic etching, anisotropic etching, a photolithographic technique and/or a direct-write technique. Additionally, these processes may utilize a wide variety of materials, including: a semiconductor, metal, glass, sapphire, an organic material, a ceramic material, a plastic and/or silicon dioxide.

Furthermore, electrical connections between the base plate and the one or more island chips may be remateable or rigid. The former may facilitate re-work of the MCM.

Figure 7A:
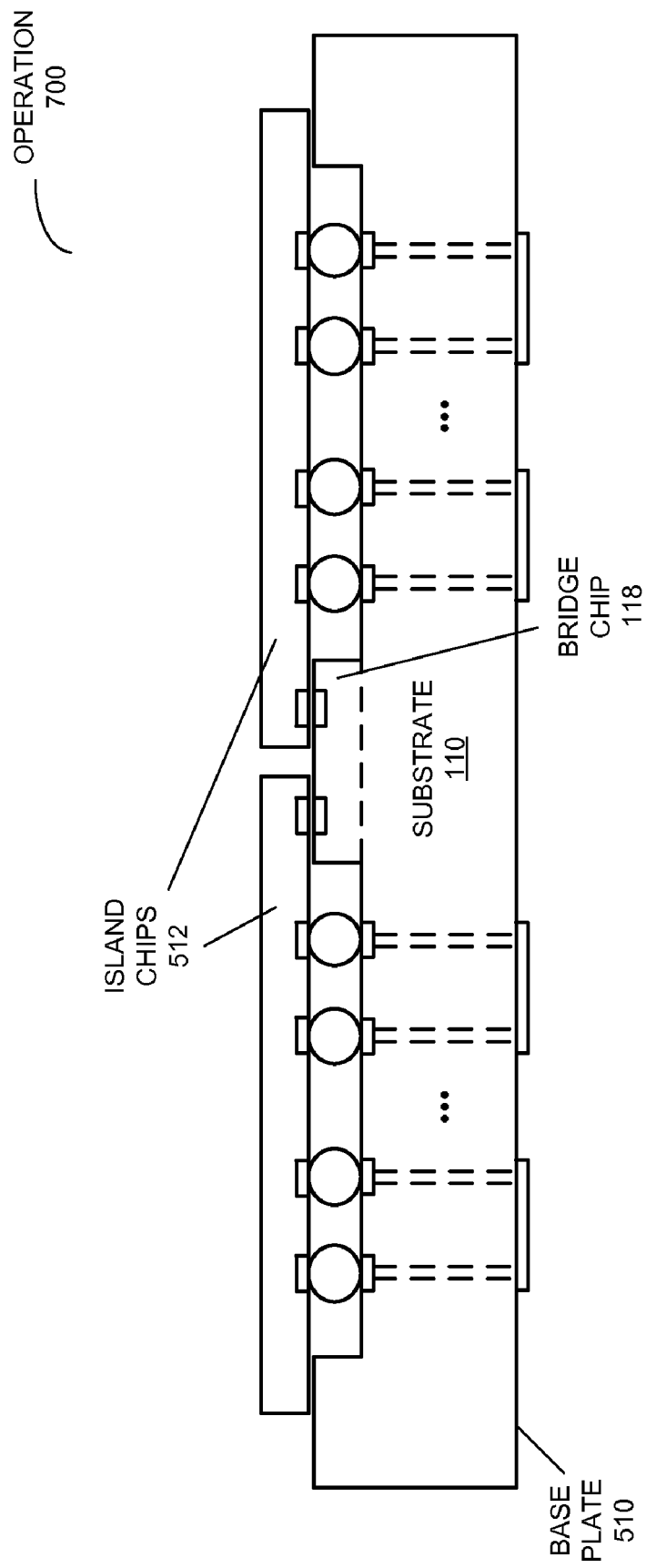
FIG. 7A is a block diagram illustrating an operation in a process for assembling an MCM in accordance with an embodiment of the present disclosure.

We now describe embodiments of processes for assembling an MCM that includes the base plate. FIG. 7A presents a block diagram illustrating an operation 700 in a process for assembling the MCM. In this operation, island chips 512 are placed proximate to the cavities in base plate 510. For example, base plate 510 may be compatible with a pick-and-place assembly process.

Figure 7B:
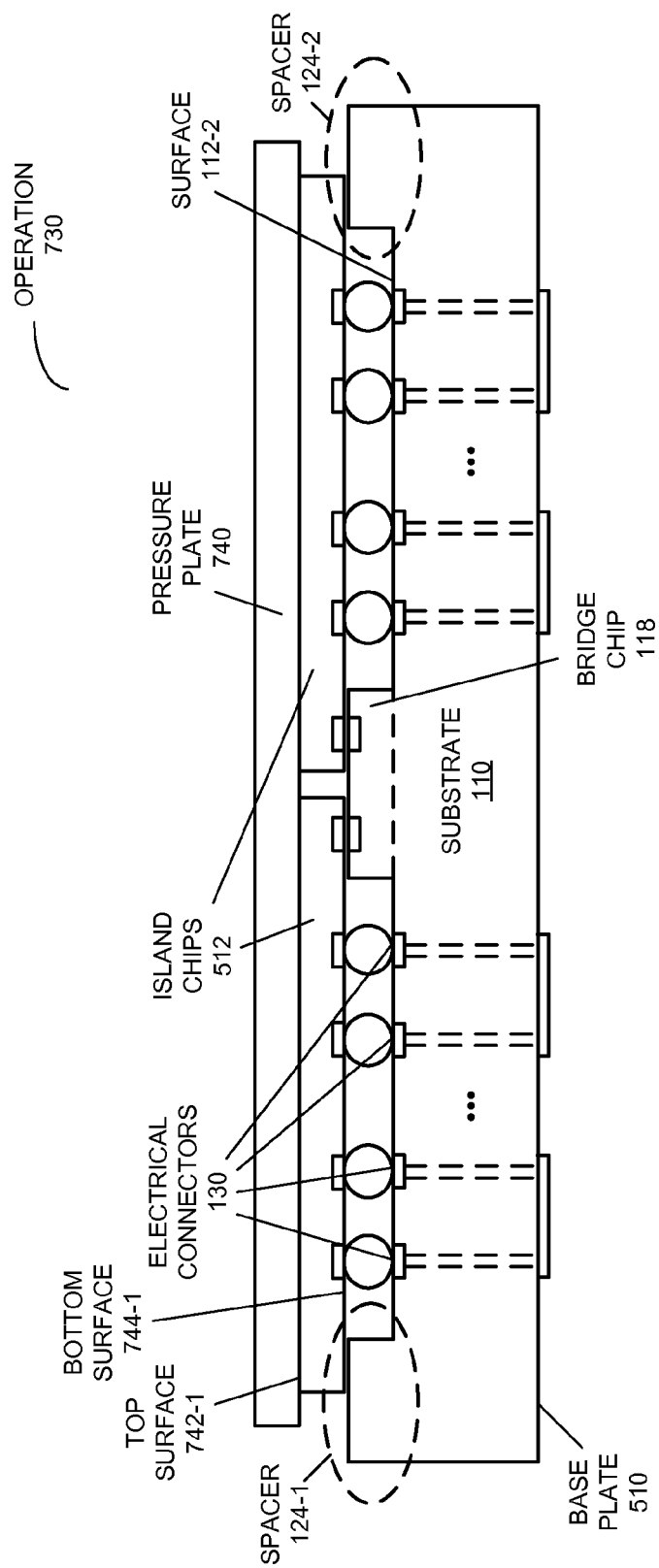
FIG. 7B is a block diagram illustrating an operation in a process for assembling an MCM in accordance with an embodiment of the present disclosure.

Then, as shown in FIG. 7B, which presents a block diagram illustrating an operation 730 in the process for assembling the MCM, pressure is applied, via at least one pressure plate 740 (or a weight plate), to top surfaces of island chips 512 in the MCM (such as top surface 742-1) while rigid mechanical coupling between bottom surfaces of island chips 512 (such as bottom surface 744-1) and surface 112-2 of base plate 510 in the MCM is established via electrical connectors 130. For example, the rigid mechanical coupling may involve a solder reflow-and-solidification process. Note that island chips 512 may be optionally held in place using a pressure less than atmospheric pressure (i.e., vacuum) while the rigid mechanical coupling to surface 112-2 is established. Furthermore, while FIG. 7B shows island chips 512 stably supported by spacers 124 and bridge chip 118, spacer-height variations may occur. This can be compensated for using the solder-ball sizes.

Note that with pressure plate 740, the z-axis gap between island chips 512 and bridge chip 118 proximate to the proximity communication connectors may be small or near zero during reflow. After solder solidification and possible underfill cure (with pressure plate 740 still in place), the position of the solder balls may be fixed, and therefore the z-axis gap between the island chips 512 and bridge chip 118 may be fixed, too. Furthermore, the in-plane (x-y) alignment tolerance may be large enough (for example, 18 μm) so that a pick-and-place tool can achieve an alignment accuracy requirement of the MCM.

While pressure plate 740 may be sufficient to ensure that the z-gaps fall within a specified range (such as less than 1 μm), it may be difficult to ensure good contact between a monolithic pressure plate and all of island chips 512. Consequently, as shown in FIG. 7C, which presents a block diagram illustrating an operation 760 in the process for assembling the MCM, in some embodiments there are multiple pressure plates 770, where a given pressure plate in the multiple pressure plates (such as pressure plate 770-1) applies pressure to the top surface of a given island chip in island chips 512.

These operations are also shown in FIG. 8, which presents a flow chart illustrating a process 800 for assembling the MCM. During this method, one or more of the island chips are placed proximate to cavities in the base mechanism in the MCM (operation 810). Note that the cavities are defined by the spacers and the bridge chip on the top surface of the base mechanism, and that the bridge chip is rigidly mechanically coupled to the top surface of the base mechanism. Furthermore, the second electrical connectors are disposed on the top surface of the base mechanism within the cavities, and there are proximity communication connectors disposed on the top surface of the bridge chip to communicate information via proximity communication with the one or more island chips. Then, pressure is applied, via at least one pressure plate, to top surfaces of the one or more island chips in the MCM while rigid mechanical coupling between the bottom surfaces of the island chips and the top surface of the base mechanism in the MCM is established via the electrical connectors (operation 812).

In some embodiments, during the method the island chips are optionally held in place using a pressure less than atmospheric pressure (i.e., vacuum) while the rigid mechanical coupling is established (operation 814).

Figure 7C:
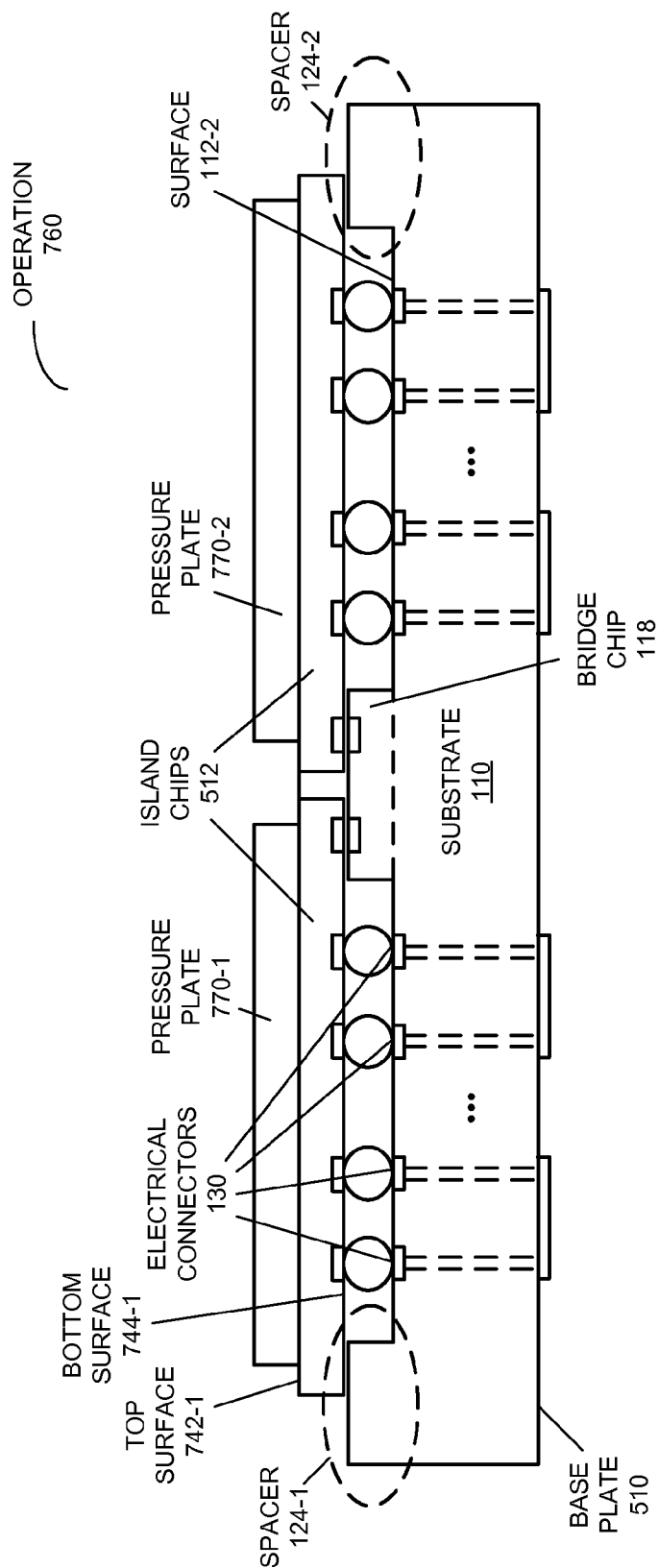
FIG. 7C is a block diagram illustrating an operation in a process for assembling an MCM in accordance with an embodiment of the present disclosure.

In some embodiments of the process in FIGS. 7A-7C and/or process 800, there are additional or fewer operations. Moreover, the order of the operations may be changed, and/or two or more operations may be combined into a single operation.

While embodiments of the base plate have been illustrated in conjunction with the embodiments of the MCM, in other embodiments the base plate may be used in a variety of different applications to provide electrical and mechanical coupling to arbitrary components in devices other than the MCM.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A base mechanism for use in a multi-chip module (MCM), comprising:
    a first substrate having a first surface and a second surface, wherein first electrical connectors that convey power are disposed on the first surface, and wherein the first substrate includes through-substrate vias (TSVs) between the first surface and the second surface which are electrically coupled to the first electrical connectors;
    a bridge chip rigidly mechanically coupled to the second surface, wherein proximity communication connectors are disposed on a top surface of the bridge chip to communicate information via proximity communication with one or more island chips in the MCM; and
    spacers, rigidly mechanically coupled to the second surface, which in conjunction with the bridge chip define cavities on the second surface that have a depth, wherein second electrical connectors are disposed on the second surface within the cavities to communicate additional information with and convey power to the one or more island chips, and wherein the second electrical connectors are electrically coupled to the TSVs, wherein the second electrical connectors in the cavities are configured to couple directly to corresponding electrical connectors on the island chips.

2. The base mechanism of claim 1, wherein the first substrate includes a semiconductor, a ceramic material, an organic material or a printed circuit board.

3. The base mechanism of claim 1, wherein the bridge chip includes a second substrate;
    wherein the second substrate includes a semiconductor; and wherein transmit and receive electrical circuits are disposed on the semiconductor.

4. The base mechanism of claim 1, wherein the bridge chip includes a second substrate;
   wherein the second substrate includes a material other than a semiconductor; and
   wherein the bridge chip is a passive device.

5. The base mechanism of claim 1, wherein the bridge chip is defined on the first substrate.

6. The base mechanism of claim 1, wherein the bridge chip includes additional TSVs that are electrically coupled to the proximity communication connectors and to solder connections to the second surface.

7. The base mechanism of claim 1, wherein the bridge chip is embedded in the first substrate.

8. The base mechanism of claim 7, wherein the first substrate is built up around sides of the bridge chip.

9. The base mechanism of claim 1, wherein the proximity communication includes optical proximity communication, capacitive proximity communication, inductive proximity communication or conductive proximity communication.

10. The base mechanism of claim 1, wherein the spacers are defined using an additive fabrication process.

11. The base mechanism of claim 1, wherein the spacers are defined using a subtractive fabrication process.

12. The base mechanism of claim 1, wherein the second electrical connectors include solder pads, an interposer or microspring inter-component connectors.

13. The base mechanism of claim 12, wherein the microspring inter-component connectors include claw connectors.

14. The base mechanism of claim 1, wherein the second electrical connectors provide mechanical compliance greater than a predefined value in a direction perpendicular to the second surface.

15. The base mechanism of claim 1, wherein the second electrical connectors include additional proximity communication connectors.

16. The base mechanism of claim 1, wherein the proximity communication connectors are arranged in selectable groups that facilitate the use of the base mechanism in different configurations of the MCM in which a given island chip communicates the information with the base mechanism via one or more of the selectable groups.

17. An MCM, comprising:
   one or more island chips having first proximity communication connectors disposed on first surfaces of the one or more island chips; and
   a base mechanism, including:
   a first substrate having a second surface and a third surface, wherein first electrical connectors that convey power are disposed on the second surface, and wherein the first substrate includes through-substrate vias (TSVs) between the second surface and the third surface which are electrically coupled to the first electrical connectors;
   a bridge chip rigidly mechanically coupled to the third surface, wherein second proximity communication connectors are disposed on a top surface of the bridge chip to communicate information via proximity communication with the first proximity communication connectors of the one or more island chips; and
   spacers, rigidly mechanically coupled to the third surface, which in conjunction with the bridge chip define cavities on the third surface that have a depth, wherein second electrical connectors are disposed on the third surface within the cavities to communicate additional information with and convey power to the one or more island chips, and wherein the second electrical connectors are electrically coupled to the TSVs, wherein the second electrical connectors in the cavities are configured to couple directly to corresponding electrical connectors on the island chips.

18. A method for assembling an MCM, comprising:
   placing one or more island chips proximate to cavities in a base mechanism in the MCM that comprises a substrate, wherein the cavities are defined by spacers and a bridge chip on a top surface of the base mechanism, wherein the bridge chip is rigidly mechanically coupled to the top surface of the base mechanism, wherein there are electrical connectors disposed on the top surface of the base mechanism within the cavities that are configured to couple directly to corresponding electrical connectors on the island chips, and wherein there are proximity communication connectors disposed on a top surface of the bridge chip to communicate information via proximity communication with the one or more island chips; and
   applying a pressure, via at least one pressure plate, to top surfaces of one or more island chips in the MCM while rigid mechanical coupling between bottom surfaces of the island chips and the top surface of the base mechanism in the MCM is established via the electrical connectors.

19. The method of claim 18 wherein the method further comprises holding the island chips in place using a pressure less than atmospheric pressure while the rigid mechanical coupling is established.

20. The method of claim 18 wherein there are multiple pressure plates; and
   wherein a given pressure plate in the multiple pressure plates applies pressure to a top surface of a given island chip in the one or more island chips.

* * * * *